US009810751B2

(12) United States Patent
Bulatowicz

(10) Patent No.: US 9,810,751 B2
(45) Date of Patent: Nov. 7, 2017

(54) CUSTOMIZED MAGNETIC SUSCEPTIBILITY MATERIALS

(71) Applicant: Michael D. Bulatowicz, Canoga Park, CA (US)

(72) Inventor: Michael D. Bulatowicz, Canoga Park, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 408 days.

(21) Appl. No.: 14/188,374

(22) Filed: Feb. 24, 2014

(65) Prior Publication Data

US 2015/0241527 A1    Aug. 27, 2015

(51) Int. Cl.
| | | |
|---|---|---|
| *G01R 33/34* | (2006.01) | |
| *B32B 15/00* | (2006.01) | |
| *B32B 15/01* | (2006.01) | |
| *B32B 18/00* | (2006.01) | |
| *C04B 37/00* | (2006.01) | |

(Continued)

(52) U.S. Cl.
CPC ............... *G01R 33/34* (2013.01); *B05D 7/52* (2013.01); *B32B 15/00* (2013.01); *B32B 15/01* (2013.01); *B32B 18/00* (2013.01); *C04B 37/001* (2013.01); *C04B 37/021* (2013.01); *G01C 19/00* (2013.01); *G01C 19/60* (2013.01); *G01R 33/00* (2013.01); *G01R 33/56536* (2013.01); *C04B 2237/34* (2013.01); *C04B 2237/348* (2013.01);

(Continued)

(58) Field of Classification Search
None
See application file for complete search history.

(56) References Cited

U.S. PATENT DOCUMENTS 5,427,103 A * 6/1995 Fujio .................... A61B 1/0051
600/101
6,411,092 B1 * 6/2002 Anderson ........ G01R 33/34069
324/307

(Continued)

FOREIGN PATENT DOCUMENTS

EP    0 393 932 A1    10/1990
EP    0 673 621 B1    3/1998

(Continued)

OTHER PUBLICATIONS

Office Action dated Nov. 1, 2016 for corresponding JP application No. 2015-031904 (attached hereto).

(Continued)

*Primary Examiner* — Mandy Louie
(74) *Attorney, Agent, or Firm* — Tarolli, Sundheim, Covell & Tummino LLP

(57) ABSTRACT

One example includes a method for fabricating a compound material. The method includes providing a first discrete material layer having a first thickness dimension. The first discrete material layer includes a first material having a first magnetic susceptibility. The method also includes depositing a second discrete material layer having a second thickness dimension over the first discrete material layer. The second discrete material layer can include a second material having a second magnetic susceptibility. The relative first and second thickness dimensions can be selected to provide a desired magnetic susceptibility of the compound material.

9 Claims, 3 Drawing Sheets

(51) Int. Cl.
*C04B 37/02* (2006.01)
*G01C 19/00* (2013.01)
*G01C 19/60* (2006.01)
*B05D 7/00* (2006.01)
*G01R 33/565* (2006.01)
*G01R 33/00* (2006.01)
*G01R 33/42* (2006.01)

(52) U.S. Cl.
CPC .... *C04B 2237/36* (2013.01); *C04B 2237/408* (2013.01); *G01R 33/42* (2013.01); *Y10T 428/23* (2015.01)

(56) References Cited

U.S. PATENT DOCUMENTS

| | | | |
|---|---|---|---|
| 7,344,559 | B2 | 3/2008 | Gray et al. |
| 7,560,922 | B2 | 7/2009 | Barbara et al. |
| 8,400,153 | B2 | 3/2013 | Evers et al. |
| 2005/0107870 | A1 | 5/2005 | Wang et al. |
| 2005/0260331 | A1 | 11/2005 | Wang et al. |
| 2006/0084861 | A1* | 4/2006 | Blank ............... A61B 5/02007 600/423 |
| 2012/0042993 | A1* | 2/2012 | Ripley ............... C21D 9/00 148/513 |
| 2012/0177853 | A1* | 7/2012 | Gruenwald ........... H01L 23/055 428/34.4 |

FOREIGN PATENT DOCUMENTS

| | | |
|---|---|---|
| EP | 1 193 505 A2 | 4/2002 |
| EP | 1 668 655 B1 | 3/2010 |
| JP | 2000 266828 A | 9/2000 |
| JP | 2002162455 A | 6/2002 |
| JP | 2002206101 A | 7/2002 |
| JP | 2003 011268 A | 1/2003 |
| JP | 2007 255991 A | 10/2007 |
| JP | 2007263621 A | 10/2007 |
| JP | 2008082751 A | 4/2008 |
| JP | 2009 175081 A | 8/2009 |
| WO | WO 2006/083668 A2 | 8/2006 |

OTHER PUBLICATIONS

EP Search Report for corresponding EP15155945.7-1354 dated Jun. 8, 2015; completed May 26, 2015 by Brian Munro of Munich.

Wakuda, Tsuyoshi, et al., "Performance of a novel NMR Apparatus with a Solenoidal Tape-Shaped Antenna and a Split-Type Superconducting Magnet." *Concepts in Magnetic Resonance Part B: Magnetic Resonance Engineering* 43B (2013): 79-89.

* cited by examiner

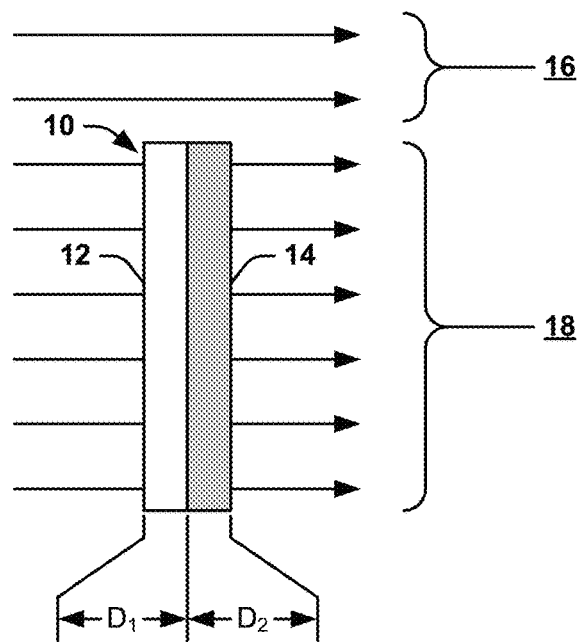
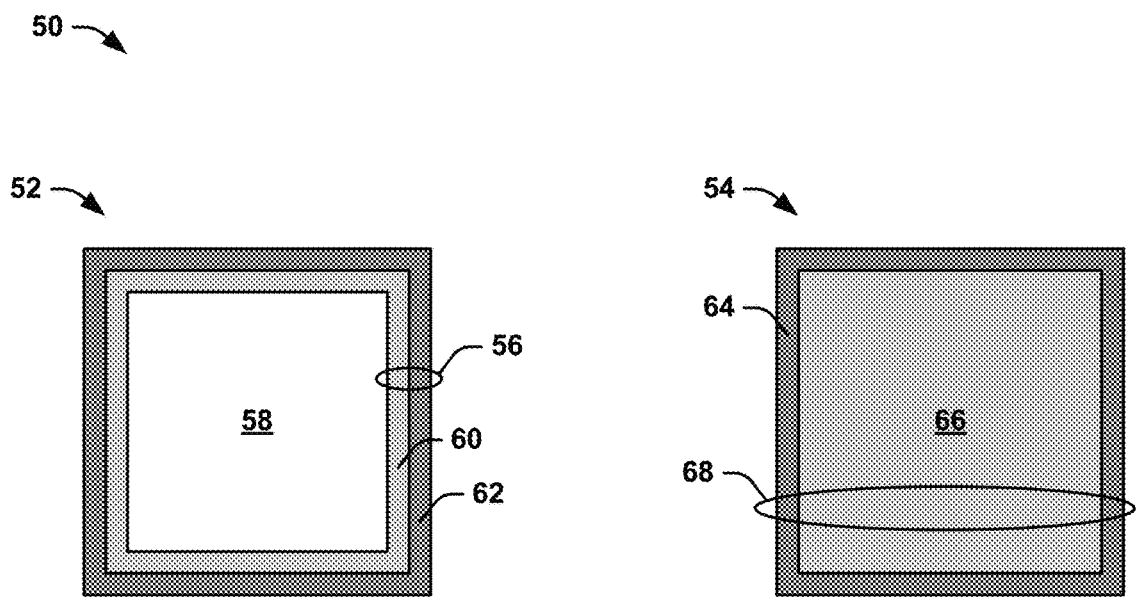

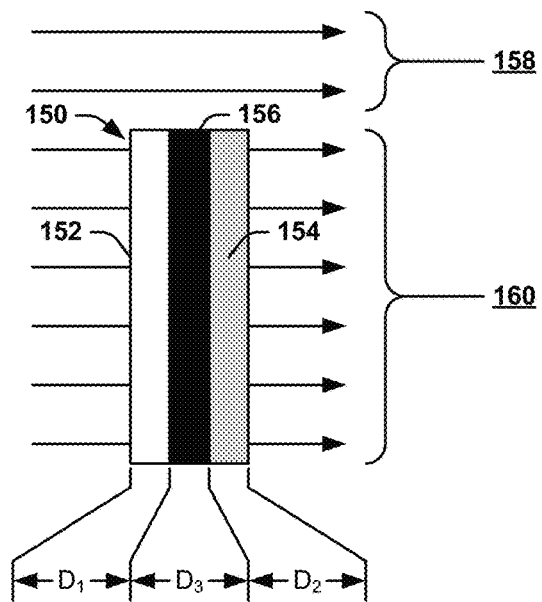

┌─ 202
| PROVIDE A FIRST DISCRETE MATERIAL LAYER HAVING A FIRST THICKNESS DIMENSION, THE FIRST DISCRETE MATERIAL LAYER COMPRISING A FIRST MATERIAL HAVING A FIRST MAGNETIC SUSCEPTIBILITY |

┌─ 204
| DEPOSIT A SECOND DISCRETE MATERIAL LAYER HAVING A SECOND THICKNESS DIMENSION OVER THE FIRST DISCRETE MATERIAL LAYER, THE SECOND DISCRETE MATERIAL LAYER COMPRISING A SECOND MATERIAL HAVING A SECOND MAGNETIC SUSCEPTIBILITY, THE RELATIVE FIRST AND SECOND THICKNESS DIMENSIONS BEING SELECTED TO PROVIDE A DESIRED MAGNETIC SUSCEPTIBILITY OF THE COMPOUND MATERIAL |

FIG. 5

CUSTOMIZED MAGNETIC SUSCEPTIBILITY MATERIALS

TECHNICAL FIELD

This disclosure relates generally to engineered materials, and more specifically to customized magnetic susceptibility materials.

BACKGROUND

Magnetic susceptibility is a measurement of the difference between the magnetic permeability of a material and the magnetic permeability of vacuum, typically expressed in parts per million (ppm) difference relative to vacuum. A material with a non-zero magnetic susceptibility, subjected to a uniform magnetic field in a vacuum, will distort the magnetic field by way of differences in the magnetic flux density inside the material versus outside it. This distortion causes localized changes in both the magnitude and direction of the applied magnetic field in the vicinity of the material. Many magnetically sensitive instruments can be sensitive to distortion of the associated magnetic fields, and can thus experience a performance degradation when exposed to magnetic field gradients. As an example, it can often be ideal for magnetic fields in a given instrument or enclosure to be approximately uniform.

SUMMARY

One example includes a method for fabricating a compound material. The method includes providing a first discrete material layer having a first thickness dimension. The first discrete material layer includes a first material having a first magnetic susceptibility. The method also includes depositing a second discrete material layer having a second thickness dimension over the first discrete material layer. The second discrete material layer can include a second material having a second magnetic susceptibility. The relative first and second thickness dimensions can be selected to provide a desired magnetic susceptibility of the compound material.

Another example includes a substantially enclosed structure comprising a compound material from which the substantially enclosed structure is constructed. The compound material includes a first discrete material layer that is substantially interior with respect to the substantially enclosed structure. The first discrete material layer can have a first thickness dimension and comprising a first material having a first magnetic susceptibility. The compound material also includes a second discrete material layer that is substantially exterior with respect to the substantially enclosed structure. The second discrete material layer can have a second thickness dimension and can include a second material having a second magnetic susceptibility. The relative first and second thickness dimensions can be selected to provide a desired magnetic susceptibility of the compound material.

Another embodiment includes a method for fabricating a substantially enclosed structure. The method includes providing a first discrete material layer having a first thickness dimension as an interior layer with respect to the substantially enclosed material. The first discrete material layer includes a first material that is one of magnetic, paramagnetic, and diamagnetic. The method also includes depositing a second discrete material layer having a second thickness dimension over the first discrete material layer as an exterior layer with respect to the substantially enclosed structure. The second discrete material layer can include a second material that is another of magnetic, paramagnetic, and diamagnetic relative to the first material. The relative first and second thickness dimensions can be selected to provide an aggregate magnetic susceptibility that is approximately equal to a surrounding medium.

BRIEF DESCRIPTION OF THE DRAWINGS

FIG. 1 illustrates an example of a compound material.

FIG. 2 illustrates an example of a substantially enclosed structure.

FIG. 4 illustrates another example of a compound material.

FIG. 5 illustrates an example of a method for fabricating a compound material.

DETAILED DESCRIPTION

Figure 3:
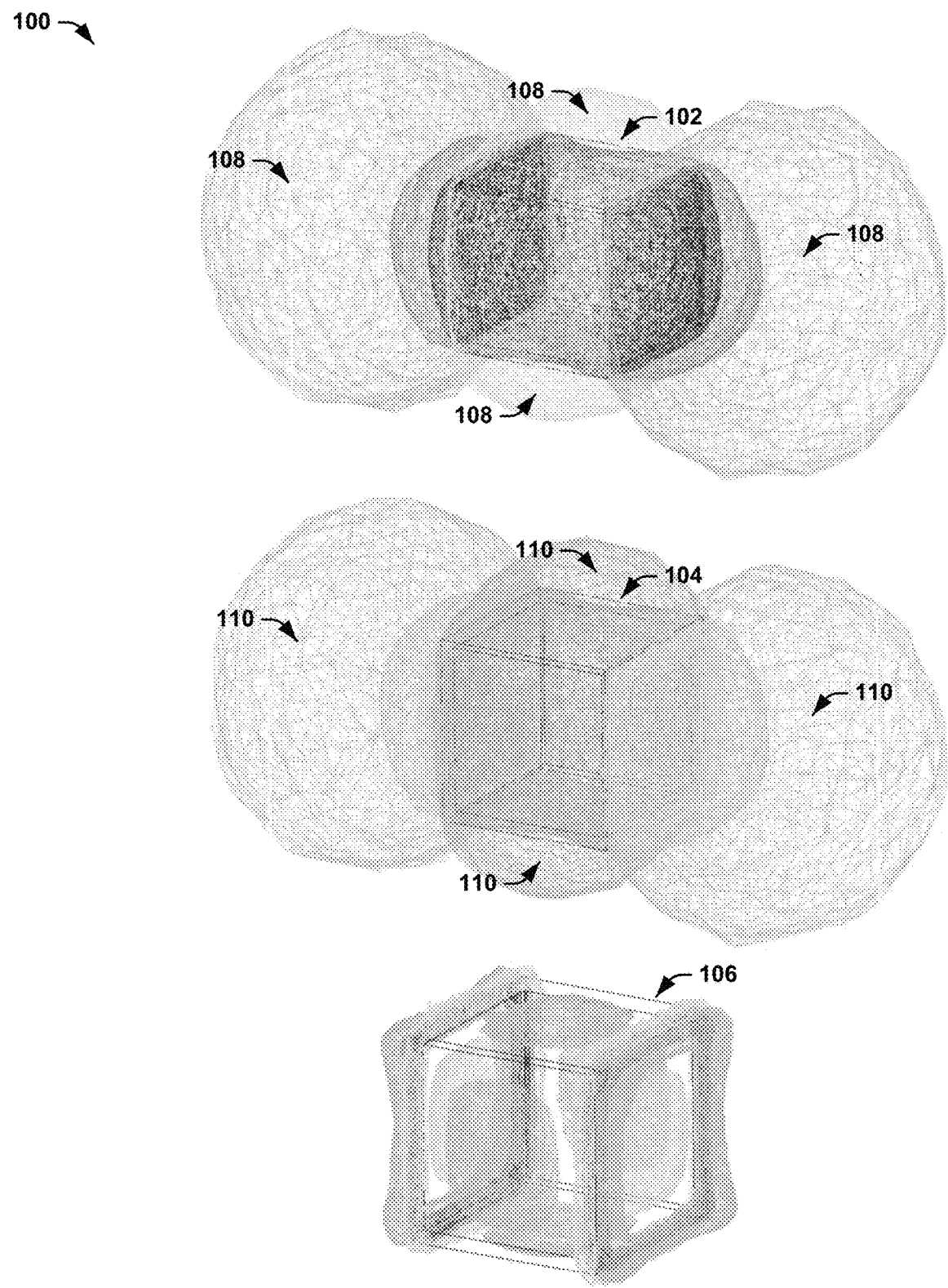
FIG. 3 illustrates an example diagram of magnetic field distortion associated with separate structures.

This disclosure relates generally to engineered materials, and more specifically to customized magnetic susceptibility materials. A given material, such as provided to construct an at least partial enclosure or substantially enclosed structure, can be fabricated as a compound material including discrete material layers. The compound material can include a first discrete material layer having a first thickness dimension, and can be formed from a first material having a first magnetic susceptibility. As an example, the first material can be a magnetic, a paramagnetic (i.e., having a positive magnetic field susceptibility), or a diamagnetic (i.e., having a negative magnetic field susceptibility) material. The compound material can also include a second discrete material layer having a second thickness dimension and which is deposited over the first discrete material layer. The second discrete material layer can be formed from a second material having a second magnetic susceptibility. As another example, the second material can be the another of magnetic, paramagnetic, or diamagnetic with respect to the first material. The relative first and second thickness dimensions can be selected to provide a desired aggregate magnetic susceptibility of the first and second discrete material layers, and thus a desired magnetic susceptibility of the compound material. For example, the desired magnetic susceptibility can be approximately equal to a surrounding medium, such as a vacuum, atmospheric air, or water.

FIG. 1 illustrates an example of a compound material 10. The compound material 10 can be implemented in a variety of applications to provide a desired magnetic susceptibility, such as for an at least partially enclosed structure. For example, the compound material 10 can be implemented in the construction of a variety of devices, such as a solenoid casing for a variety of different types of sensors (e.g., a nuclear magnetic resonance (NMR) or electron paramagnetic resonance (EPR) sensor system) or a variety of different types of manned or unmanned vehicles (e.g., a spacecraft or undersea watercraft). The compound material 10 can be fabricated in a manner to exhibit a magnetic susceptibility of a desired value, such as approximately equal to a surrounding medium (e.g., a vacuum, atmospheric air, or water).

The compound material 10 includes a first discrete material layer 12 and a second discrete material layer 14. In the example of FIG. 1, the first discrete material layer 12 has a thickness dimension $D_1$ and the second discrete material layer 14 has a thickness dimension $D_2$. As an example, the first and second discrete material layers 12 and 14 can be provided in a variety of physical forms (e.g., crushed particles, fibers, crystalline layering, etc.) that are provided in a volumetric arrangement with respect to each other (e.g., as dictated by the relative thickness dimensions $D_1$ and $D_2$) to achieve an aggregate magnetic susceptibility. As an example, the second discrete material layer 14 can be formed as a coating of the second material on the first discrete material layer 12, such as based on a variety of different deposition techniques, such as electroplating.

The first discrete material layer 12 can be formed from a variety of materials having a known magnetic susceptibility. For example, the material of the first discrete material layer 12 can be either magnetic, paramagnetic (i.e., having a positive magnetic field susceptibility), or diamagnetic (i.e., having a negative magnetic field susceptibility). Similarly, the second discrete material layer 14 can be formed from a variety of materials different from the material of the first discrete material layer 12 having a known magnetic susceptibility. For example, the material of the second discrete material layer 14 can be magnetic, paramagnetic, or diamagnetic, such as different from the material of the first discrete material layer 12. For example, the material of the first discrete material layer 12 can be paramagnetic while the material of the second discrete material layer 14 can be diamagnetic, or vice-versa. Thus, the compound material 10 can include a volumetric combination (e.g., based on the thickness dimensions $D_1$ and $D_2$) of the different known magnetic susceptibilities of the first and second discrete material layers 12 and 14, such as to provide a desired aggregate magnetic susceptibility of the compound material 10.

As a result of fabricating the compound material 10 in a manner that controls the volumetric combination of the first and second discrete material layers 12 and 14, a magnetic flux density inside the compound material 10 can be manipulated relative to outside of the compound material 10. Therefore, a magnitude of a magnetic field through the compound material 10, demonstrated by the arrows at 16, can be manipulated relative to the magnitude of the magnetic field outside of the compound material 10, demonstrated by the arrows at 18. For example, for the first and second discrete material layers 12 and 14 to be paramagnetic and diamagnetic materials, respectively, having respective relative thickness dimensions $D_1$ and $D_2$, the compound material 10 can have a desired aggregate magnetic susceptibility of approximately zero, and thus approximately equal to a magnetic susceptibility of a surrounding medium of a vacuum. Alternatively, the desired aggregate magnetic susceptibility of the compound material 10 can be manipulated to be non-zero, such as to be approximately equal to a different surrounding medium (e.g., water or atmospheric air). Accordingly, the magnitude of the magnetic field 16 through the compound material 10 can be approximately equal to the magnitude of the magnetic field 18 outside of the compound material 10. As a result, a magnetic field uniformity can be achieved in an at least partially enclosed structure that is fabricated from the compound material 10 in response to an applied magnetic field. As a second result, the distortion and redistribution of the magnetic field 18 which results from the interaction of the magnetic field 18 with the compound material 10 can be substantially reduced as compared to the interaction of the magnetic field 18 with either of the first and second material layers 12 and 14 considered individually.

As an example, for a diamagnetic first discrete material layer 12 and a paramagnetic second discrete material layer 14, to achieve a desired aggregate magnetic susceptibility of the compound material 10 of approximately zero, the first and second thickness dimensions $D_1$ and $D_2$ can have a respective opposite relative ratio with respect to a total volume. For example, the first thickness dimension $D_1$ of the first discrete material layer 12 can be selected to be approximately equal to an absolute value of the magnetic susceptibility of the material of the second discrete material layer 14 divided by a magnitude sum of the magnetic susceptibilities of the materials of the first and second discrete material layers 12 and 14. Similarly, the second thickness dimension $D_2$ of the second discrete material layer 14 can be selected to be approximately equal to an absolute value of the magnetic susceptibility of the material of the first discrete material layer 12 divided by a magnitude sum of the magnetic susceptibilities of the materials of the first and second discrete material layers 12 and 14.

For instance, the first discrete material layer 12 can be gold (e.g., having a magnetic susceptibility of approximately −28 parts per million (ppm)), and the second discrete material layer 14 can be tungsten carbide (e.g., having a magnetic susceptibility of approximately +10 ppm). Therefore, the first thickness dimensions $D_1$ can be selected to be approximately 26% (i.e., 10/38) of the total thickness (e.g., total volume) of the compound material 10, and the second thickness dimensions $D_2$ can be selected to be approximately 74% (i.e., 28/38) of the total thickness (e.g., total volume) of the compound material 10. Therefore, the aggregate magnetic susceptibility of the compound material 10 can be approximately zero, and thus approximately equal to a surrounding vacuum. Accordingly, the magnitude of the magnetic field 16 through the compound material 10 can be approximately equal to the magnitude of the magnetic field 18 outside of the compound material 10, and the distortion of the magnetic field 18 which can result from either of the materials of the first and second discrete material layers 12 and 14 individually is correspondingly reduced.

As another example, the first discrete material layer 12 can be a zirconium oxide ceramic (i.e., zirconia, such as having a magnetic susceptibility of approximately −13.8 ppm), and the second discrete material layer 14 can be an yttrium oxide ceramic (i.e., yttria, such as having a magnetic susceptibility of approximately +44.4 ppm). Therefore, the first thickness dimensions $D_1$ can be selected to be approximately 24% (i.e., 13.8/58.2) of the total thickness (e.g., total volume) of the compound material 10, and the second thickness dimensions $D_2$ can be selected to be approximately 76% (i.e., 44.4/58.2) of the total thickness (e.g., total volume) of the compound material 10. Therefore, the aggregate magnetic susceptibility of the compound material 10 can be approximately zero, and thus approximately equal to a surrounding vacuum. Accordingly, the magnitude of the magnetic field 16 through the compound material 10 can be approximately equal to the magnitude of the magnetic field 18 outside of the compound material 10, and the distortion of the magnetic field 18 which can result from either of the materials of the first and second discrete material layers 12 and 14 individually is correspondingly reduced.

As described previously, the surrounding medium can be different from a vacuum, such as water. Thus, as yet another example, the first discrete material layer 12 and the second discrete material layer 14 can be zirconia and yttria ceramics, similar to as described previously, but can be provided in different relative material thickness dimensions $D_1$ and $D_2$ to provide a desired aggregate magnetic susceptibility that is approximately equal to water (e.g., approximately 9.0 ppm). For example, the first thickness dimensions $D_1$ can be selected to be approximately 8.2% (i.e., 4.8/58.2) of the total thickness (e.g., total volume) of the compound material 10, and the second thickness dimensions $D_2$ can be selected to be approximately 91.8% (i.e., 53.4/58.2) of the total thickness (e.g., total volume) of the compound material 10. Therefore, the aggregate magnetic susceptibility of the compound material 10 can be approximately equal to surrounding water to provide the magnitude of the magnetic field 16 through the compound material 10 to be approximately equal to the magnitude of the magnetic field 18 outside of the compound material 10, and the distortion of the magnetic field 18 which can result from either of the materials of the first and second discrete material layers 12 and 14 individually is correspondingly reduced.

As described previously, the compound material 10 can be implemented in fabrication of a structure or an enclosure, such as an at least partial enclosure or substantially enclosed structure. As a result, the first and second discrete material layers 12 and 14 can be arranged in a manner with respect to the structure or enclosure to affect material properties of the structure or enclosure. In other words, because the compound material 10 is fabricated with discrete material layers, the discrete material layers 12 and 14 can be arranged as interior and external layers that provide separate electromechanical and/or thermal material properties with respect to the structure or enclosure. As an example, the external one of the discrete material layers 12 and 14 can be selected to have at least one enhanced material property relative to the interior one of the discrete material layers 12 and 14. For example, the enhanced material property can include mechanical properties of at least one of hardness, corrosion resistance, and abrasion resistance, can include an electrical property of relatively greater or lesser electrical conductivity, or can include thermal properties of thermal insulation and/or relatively greater or lesser emissivity. Thus, in addition to achieving the desired aggregate magnetic susceptibility, the compound material 10 can also incorporate the desired material properties of at least one of the discrete material layers 12 and 14.

FIG. 2 illustrates an example diagram 50 of substantially enclosed structures. The diagram 50 includes a first substantially enclosed structure 52 and a second substantially enclosed structure 54. The substantially enclosed structures 52 and 54 are demonstrated in the example of FIG. 2 in a cross-sectional view. As described herein and as demonstrated in the example of FIG. 2, the term "substantially enclosed structure" can likewise encapsulate the term "at least partial enclosure" and refers to a substantially three-dimensional solid or substantially hollow structure that is formed at least in part by a compound structure 10, such as demonstrated in the example of FIG. 1.

The first substantially enclosed structure 52 is demonstrated as a substantially hollow structure that includes a compound material 56 that substantially surrounds an interior space 58. In the example of FIG. 2, the compound material 56 includes a first discrete material layer 60 and a second discrete material layer 62, with the first discrete material layer 60 being arranged as an internal layer and the second discrete material layer 62 being arranged as an external layer with respect to the first substantially enclosed structure 52. As an example, the first discrete material layer 60 can correspond to the first discrete material layer 12 in the example of FIG. 1, and the second discrete material layer 62 can correspond to the second discrete material layer 14 in the example of FIG. 1. As an example, the first discrete material layer 60 can be the previously described zirconia ceramic and the second discrete material layer 62 can be the yttria ceramic, and the first and second thickness dimensions $D_1$ and $D_2$ can be set in a relative volumetric ratio to provide an aggregate magnetic susceptibility of approximately zero (e.g., equal to a vacuum) or approximately 9.0 (e.g., water). Therefore, the compound material 56 can be arranged as a tough, hard, non-conductive and non-magnetic discrete material layer that can be implemented for the first substantially enclosed structure 52 in a variety of applications, such as for a magnetic solenoid housing for a sensor system (e.g., an NMR sensor, such as an NMR gyroscope or magnetometer).

As another example, the first discrete material layer 60 can be the previously described gold (e.g., soft and malleable but highly electrically conductive, thus providing for excellent electrical shielding), and the second discrete material layer 62 can be the previously described tungsten carbide (e.g., hard, tough, and durable, but a relatively poor conductor of electricity compared to gold), and the first and second thickness dimensions $D_1$ and $D_2$ can be set in a relative volumetric ratio to provide an aggregate magnetic susceptibility of approximately zero (e.g., equal to a vacuum) or approximately 9.0 (e.g., water). Therefore, the compound material 56 can be arranged as a tough, hard, non-magnetic discrete material layer that can be implemented for the first substantially enclosed structure 52 in a variety of applications, such as for a damage-resistant, magnetically-transparent, and electrically-shielding housing for a sensor system (e.g., an atomic magnetometer or NMR gyroscope).

The second substantially enclosed structure 54 is demonstrated as a substantially solid structure that includes an exterior discrete material layer 64 that substantially surrounds an interior material 66. Thus, the second substantially enclosed structure 54 is collectively composed of a compound material 68, where the interior material 66 can correspond to the first discrete material layer 12 in the example of FIG. 1, and the exterior discrete material layer 64 can correspond to the second discrete material layer 14 in the example of FIG. 1. As an example, the interior material 66 can be the previously described tungsten carbide and the exterior discrete material layer 64 can be the previously described gold. The thickness dimension $D_1$ can correspond to a relative width of the interior material 66 and the thickness dimension $D_2$ can correspond to twice the thickness of the exterior discrete material layer 64, such as set to respective dimensions to provide a relative volume of the interior material 66 and the external discrete material layer 64 with respect to the second substantially enclosed structure 54. Thus, the relative volume can be set in a ratio to provide an aggregate magnetic susceptibility of approximately zero (e.g., equal to a vacuum) or approximately 9.0 (e.g., water). Therefore, for example, the compound material 56 can be arranged as a chemically inert, non-magnetic rod that exhibits high mass density on an outer surface.

The diagram 50 thus demonstrates two examples of substantially enclosed structures, but a large variety of other applications can be ascertained based on manipulating a volumetric ratio of the materials of a respective compound material while maintaining desired mechanical properties (e.g., of the exterior layer relative to the interior layer/material). For example, a given spacecraft can be coated with a compound material (e.g., the compound material 10) having an aggregate magnetic susceptibility that is approximately equal to zero (i.e., the vacuum of space). As another example, a given submersible watercraft can be coated with a compound material (e.g., the compound material 10) having an aggregate magnetic susceptibility that is approximately equal to 9.0 (i.e., water). Thus, near-DC magnetic signatures of such vehicles can be substantially eliminated to evade detection of such vehicles.

FIG. 3 illustrates an example diagram 100 of magnetic field distortion associated with separate structures. The example diagram 100 demonstrates a first cubical structure 102, a second cubical structure 104, and a third cubical structure 106 that are each at least partially enclosed and are all approximately the same total volume. As an example, the first cubical structure 102 can be fabricated from pure gold, the second cubical structure 104 can be fabricated from pure tungsten carbide, and the third cubical structure 106 can be fabricated from a compound material (e.g., the compound material 10) with a first (e.g., interior) discrete material layer of tungsten carbide (which could be a solid mass, such as the interior material 66 in the example of FIG. 2), and a second (e.g., exterior) discrete material layer of gold. As an example, the first and second discrete material layers of the third cubical structure 106 can have relative thickness dimensions, and thus a relative volume, to achieve an aggregate magnetic susceptibility of approximately zero. In the example of FIG. 3, the first cubical structure 102 exhibits a first localized magnetic field distortion demonstrated at 108 and the second cubical structure 104 exhibits localized magnetic field distortion demonstrated at 110, each demonstrated by a "cloud" of lines surrounding the respective cubical structures 102 and 104 in varying dimensions and locations, with the lines of the same shading corresponding to respective regions of approximately equal magnetic flux density. However, based on the compound material construction of the third cubical structure 106, the localized magnetic field distortion is significantly decreased at distances from the surface of the third cubical structure 106 relative to the first and second cubical structures 102 and 104. Accordingly, the compound material can greatly affect the magnetic flux density inside the compound material relative to the surrounding medium and substantially reduce distortion of the external magnetic field, as described previously.

FIG. 4 illustrates another example of a compound material 150. The compound material 150 can be implemented in a variety of applications to provide a desired magnetic susceptibility, such as for an at least partially enclosed structure. For example, the compound material 150 can be implemented in the construction of a variety of devices, such as a solenoid casing for a variety of different types of sensors or a variety of different types of manned or unmanned vehicles. The compound material 150 can be fabricated in a manner to exhibit a magnetic susceptibility of a desired value, such as approximately equal to a surrounding medium (e.g., a vacuum, atmospheric air, or water).

The compound material 150 includes a first discrete material layer 152 and a second discrete material layer 154. In the example of FIG. 1, the first discrete material layer 152 has a thickness dimension $D_1$ and the second discrete material layer 154 has a thickness dimension $D_2$. Additionally, the compound material 150 includes a third discrete material layer 156 that is configured as an adhesion layer, such as to provide greater adhesion of the first and second discrete material layers 152 and 154. The third discrete material layer 156 can be a non-magnetic material (e.g., titanium or copper) to which the first and second discrete material layers 152 and 154 are bonded (e.g., via electroplating). In the example of FIG. 4, the third discrete material layer 156 has a thickness dimension $D_3$. As an example, the first and second discrete material layers 152 and 154 can be provided in a variety of physical forms that are provided in a volumetric arrangement with respect to each other (e.g., as dictated by the relative thickness dimensions $D_1$ and $D_2$) to achieve an aggregate magnetic susceptibility, as described previously, but as modified by the thickness dimension $D_3$ of the third discrete material layer. Thus, the compound material 150 can include a volumetric combination (e.g., based on the thickness dimensions $D_1$, $D_2$, and $D_3$) of the different known magnetic susceptibilities of the first and second discrete material layers 152 and 154, such as to provide a desired aggregate magnetic susceptibility of the compound material 150. Therefore, a magnitude of a magnetic field through the compound material 150, demonstrated by the arrows at 158, can be manipulated relative to the magnitude of the magnetic field outside of the compound material 150, demonstrated by the arrows at 160, similar to as described previously. For example, the compound material 150 can have a desired aggregate magnetic susceptibility of approximately zero or approximately 9.0, and thus approximately equal to a magnetic susceptibility of a surrounding medium of a vacuum or water, respectively.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 5 illustrates an example of a method 200 for fabricating a compound material (e.g., the compound material 10). At 202, a first discrete material layer (e.g., the first discrete material layer 12) having a first thickness dimension (e.g., the first thickness dimension $D_1$) is provided. The first discrete material layer includes a first material having a first magnetic susceptibility. At 304, a second discrete material layer (e.g., the second discrete material layer 14) having a second thickness dimension (e.g., the second thickness dimension $D_2$) is deposited over the first discrete material layer. The second discrete material layer includes a second material having a second magnetic susceptibility. The relative first and second thickness dimensions are selected to provide a desired magnetic susceptibility of the compound material.

What have been described above are examples of the invention. It is, of course, not possible to describe every conceivable combination of components or method for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:
1. A method for fabricating a compound material, the method comprising:
providing a first discrete material layer having a first thickness dimension, the first discrete material layer comprising a first material having a first magnetic susceptibility;
depositing a second discrete material layer having a second thickness dimension over the first discrete material layer, the second discrete material layer comprising a second material having a second magnetic susceptibility different from that of the first material; and depositing a third discrete material layer of titanium or copper between the first discrete material layer and the second discrete material layer, the third discrete material layer comprising a third material having a third magnetic susceptibility different from those of the first and second materials, wherein the third discrete material layer is configured as a non-magnetic adhesion layer with respect to the first and second discrete material layers, and the relative first, second, and third thickness dimensions are selected to provide the desired magnetic susceptibility of the compound material comprising the first, second, and third discrete material layers;

and wherein one of:
the first discrete material layer is gold and the second discrete material layer is tungsten carbide, or
the first discrete material layer is a zirconium oxide ceramic and the second discrete material layer is an yttrium oxide ceramic.

2. The method of claim 1, further comprising selecting the relative first and second thickness dimensions to provide the desired magnetic susceptibility of the compound material approximately equal to a surrounding medium.

3. The method of claim 2, wherein the surrounding medium is a vacuum, wherein the first thickness dimension is selected to be approximately equal to the second magnetic susceptibility divided by a magnitude sum of the first and second magnetic susceptibilities, and wherein the second thickness dimension is selected to be approximately equal to the first magnetic susceptibility divided by the magnitude sum of the first and second magnetic susceptibilities.

4. The method of claim 1, further comprising constructing an at least partial enclosure with the compound material, such that the first layer is an interior layer with respect to the at least partial enclosure and the second discrete material layer is an exterior layer with respect to the at least partial enclosure.

5. The method of claim 4, wherein the second discrete material layer is selected to have at least one enhanced material property relative to the first discrete material layer.

6. The method of claim 4, wherein the first thickness dimension is substantially uniform about the at least partial enclosure and wherein the second thickness dimension is substantially uniform about the at least partial enclosure.

7. A method for fabricating a substantially enclosed structure, the method comprising:
providing a first discrete material layer having a first thickness dimension as an interior layer with respect to the substantially enclosed structure, the first discrete material layer comprising a first material that is one of paramagnetic and diamagnetic;

depositing a second discrete material layer having a second thickness dimension over the first discrete material layer as an exterior layer with respect to the substantially enclosed structure, the second discrete material layer comprising a second material that is the other of paramagnetic and diamagnetic relative to the first material; and depositing a third discrete material layer of titanium or copper as a non-magnetic adhesion layer between the first discrete material layer and the second discrete material layer, the third discrete material layer providing greater adhesion of the first and second discrete material layers, the third discrete material layer comprising a third material having a third magnetic susceptibility different from those of the first and second materials, the relative first, second, and third thickness dimensions being selected to provide an aggregate magnetic susceptibility that is approximately equal to a surrounding medium;

and wherein one of:
the first discrete material layer is gold and the second discrete material layer is tungsten carbide, or
the first discrete material layer is a zirconium oxide ceramic and the second discrete material layer is an yttrium oxide ceramic.

8. The method of claim 7, wherein the second discrete material layer is selected to have at least one enhanced material property relative to the first discrete material layer.

9. The method of claim 7, wherein the first thickness dimension is substantially uniform about the substantially enclosed structure and wherein the second thickness dimension is substantially uniform about the substantially enclosed structure.

* * * * *